(12) United States Patent
Koeder et al.

(10) Patent No.: US 7,356,781 B2
(45) Date of Patent: Apr. 8, 2008

(54) METHOD FOR MODIFYING DESIGN DATA FOR THE PRODUCTION OF A COMPONENT AND CORRESPONDING UNITS

(75) Inventors: Ottmar Koeder, Otterfing (DE); Hanno Melzner, Sauerlach (DE)

(73) Assignee: Infineon Technologies AG, Munich (DE)

( * ) Notice: Subject to any disclaimer, the term of this patent is extended or adjusted under 35 U.S.C. 154(b) by 441 days.

(21) Appl. No.: 10/518,291

(22) PCT Filed: Jun. 5, 2003

(86) PCT No.: PCT/DE03/01862

§ 371 (c)(1),
(2), (4) Date: Dec. 16, 2004

(87) PCT Pub. No.: WO03/107225

PCT Pub. Date: Dec. 24, 2003

(65) Prior Publication Data

US 2005/0262466 A1    Nov. 24, 2005

(30) Foreign Application Priority Data

Jun. 17, 2002 (DE) ................................ 102 26 915

(51) Int. Cl.
    *G06F 17/50* (2006.01)
(52) U.S. Cl. ..................... 716/1; 716/2; 716/18; 703/14
(58) Field of Classification Search ................ 716/1, 716/2, 6, 18; 703/14
    See application file for complete search history.

(56) References Cited

U.S. PATENT DOCUMENTS

| | | | |
|---|---|---|---|
| 5,557,533 A | * | 9/1996 | Koford et al. ................. 716/9 |
| 5,914,887 A | | 6/1999 | Scepanovic et al. |
| 6,052,677 A | | 4/2000 | Masuoka et al. |
| 6,360,191 B1 | | 3/2002 | Koza et al. |
| 6,363,519 B1 | | 3/2002 | Levi et al. |
| 2001/0047507 A1 | | 11/2001 | Pileggi et al. |

FOREIGN PATENT DOCUMENTS

EP    0431 532 A2    6/1991

OTHER PUBLICATIONS

International Search Report from International Application No. PCT/DE03/01863.

Mehmet Aktuna, Rob A. Rutenbar and L. Richard Carley, "Device-Level Early Floorplanning Algorithms for RF Circuits" pp. 375-388, IEEE 1999.

(Continued)

*Primary Examiner*—Thuan Do
(74) *Attorney, Agent, or Firm*—Brinks Hofer Gilson & Lione

(57) ABSTRACT

A method is described in which design data are prescribed which stipulate a geometrical design for a component. The design is used to produce an altered geometrical design, for example through relocations in a region. For the two designs, assessment criteria are ascertained and compared. Depending on the comparison result, the unaltered design data are retained or are replaced with altered design data. This method is carried out for a plurality of cycles in succession in order to optimize the design.

24 Claims, 5 Drawing Sheets

OTHER PUBLICATIONS

Figure 4:
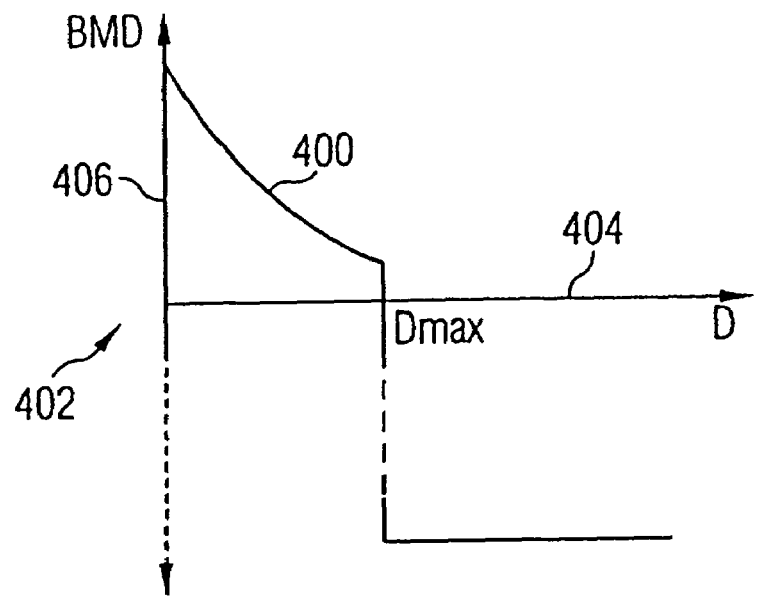

T. Arsian, D.H. Horrack and E. Ozdemir, "Structural Cell-Based VLSI Circuit Design Using a Genetic Algorithm" pp. 308-311, IEEE 1996.

N. Zhuang, M.S.T. Benten and P.Y.K. Cheung, "Improved Variable Ordering of BDDS With Novel Genetic Algorithm" pp. 414-417, IEEE 1996.

Akio Sakamoto, Xingzhao Liu and Takashi Shimamoto, "A Modified Genetic Channel Router" pp. 2076-2083, IEICE Transactions on Fundamentals of Electronics, Communications and Computer Sciences E77-A, No. 2, Dec. 1994.

Imtiaz Ahmed, Muhammad Khan Dhodhi and Frank H. Hielscher, "Design-Spaced Exploration for High-Level Synthesis" pp. 491-496, IEEE 1994.

Ernest S. Kuh and Tatsuo Ohtsuki, "Recent Advances in VLSI Layout" pp. 237-263, vol. 78, No. 2, IEEE 1990.

David J. Powell, Siu Shing Tong and Michael M. Skolnick, "Domain Independent, Machine Learning for Design Optimization" pp. 151-159, Proceeding of the Third International Conference on Genetic Algorithms, Jun. 1989.

Daniel Brand, "Hill Climbing with Reduced Search Space" pp. 294-297, IEEE 1988.

Mario P. Vecchi and Scott Kirkpatrick, "Global Wiring by Simulated Annealing" pp. 215-222, vol. CAD-2, No. 4, IEEE Oct. 1983.

Corey Kosak, Joe Marks and Stuart Shieber, *A Parallel Genetic Algorithm for Network-Diagram Layout*, pp. 458-465, Proceedings of the Fourth International Conference on Genetic Algorithms, Jul. 13-16, 1991.

German Office Action dated Oct. 24, 2006 [cited in claimed corresponding German Application No. DE 102 26 915.7].

Non-certified English translation of the German Office Action dated Oct. 24, 2006.

Brück, Rainer, "Entwurfswerkzeuge für VLSI-Layout," "Methoden und Algorithmen für den rechnergestützen Entwurf von VLSI-Layout," pp. 140-143.

Non-certified English translation of the article by Brück, Rainer, "Entwurfswerkzeuge für VLSI-Layout," "Methoden und Algorithmen für den rechnergestützen Entwurf von VLSI-Layout," pp. 140-143.

Bourai et al., "Layout Compaction for Yield Optimization via Critical Area Minimization," Electrical Engineering Department, University of Washington, ACM, 2000, pp. 122-125.

\* cited by examiner

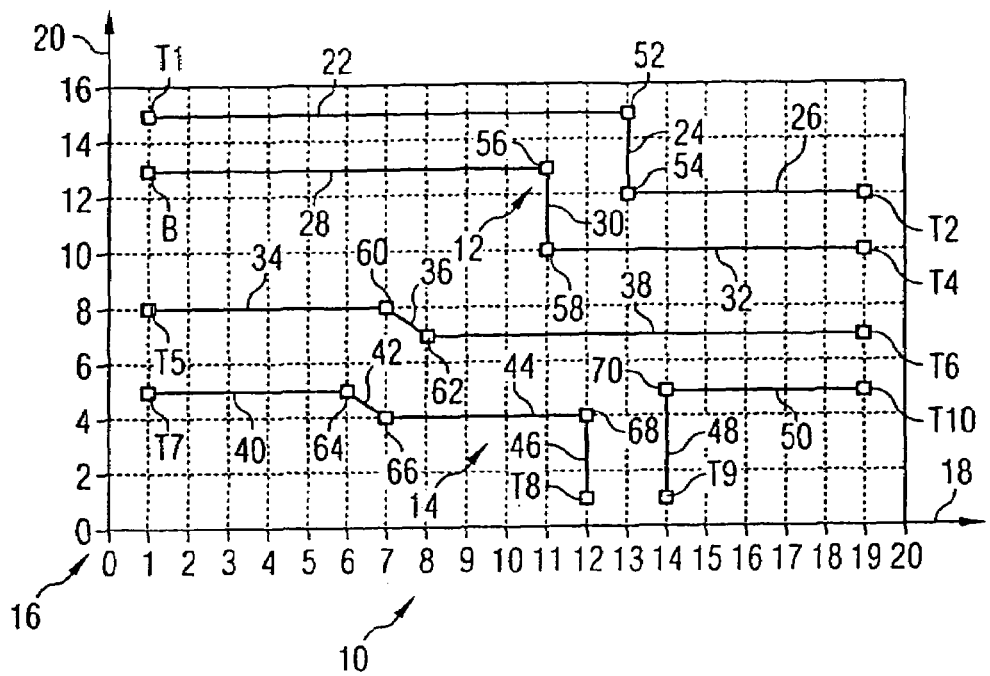
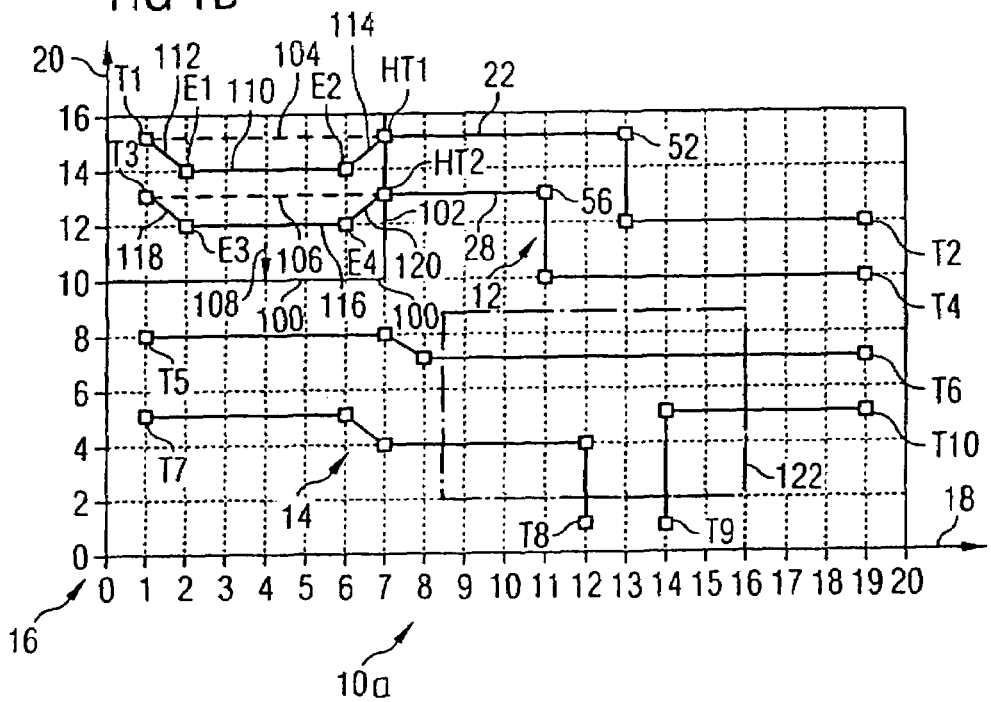

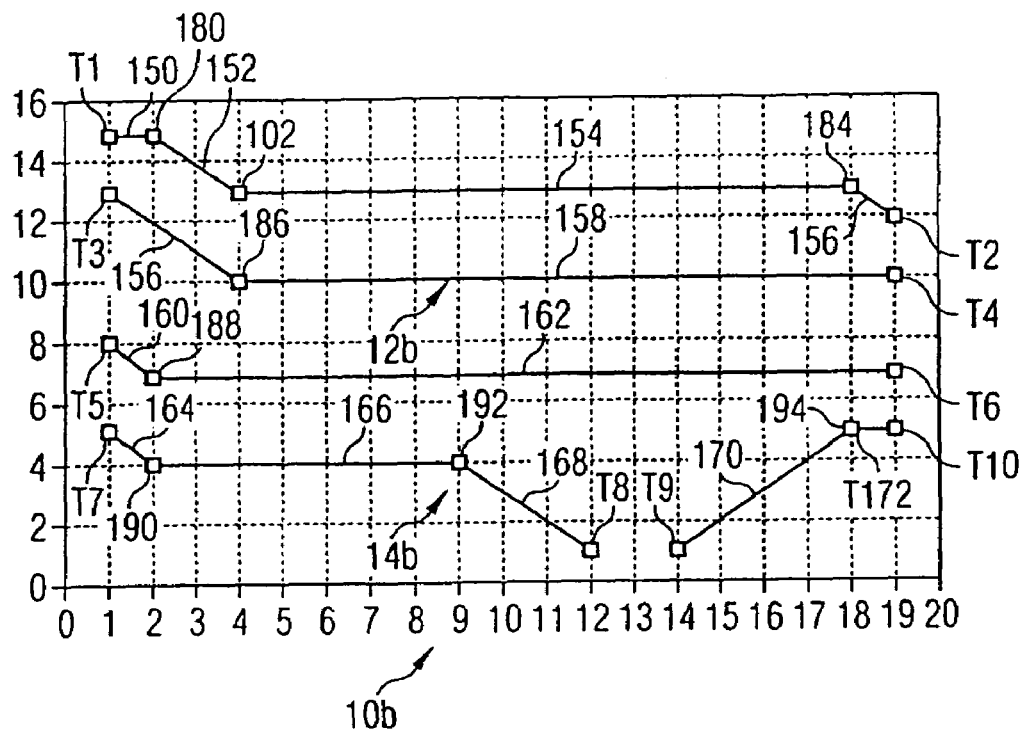
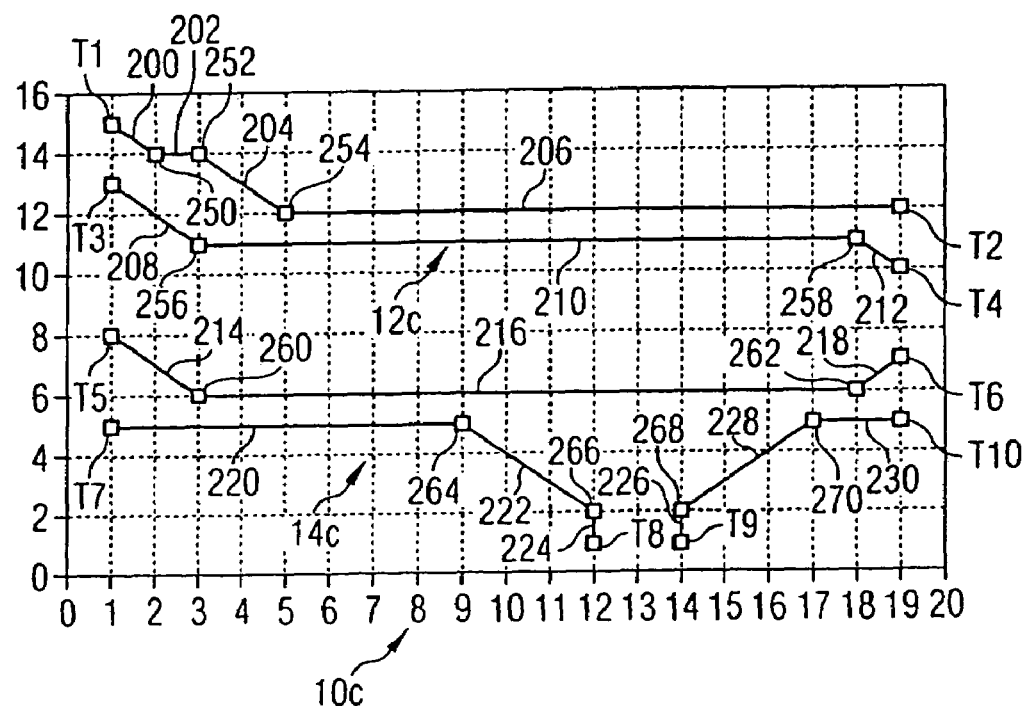

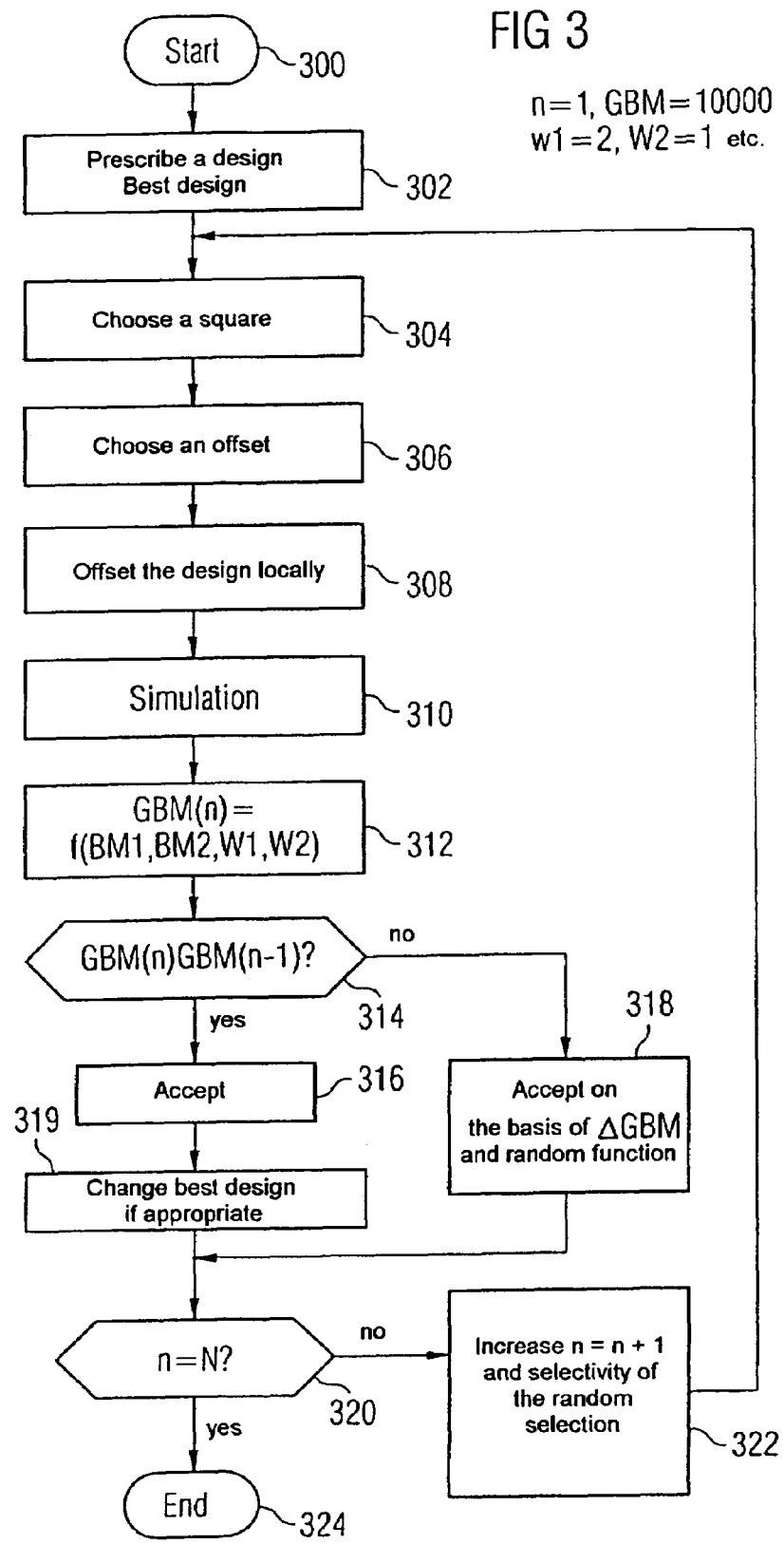

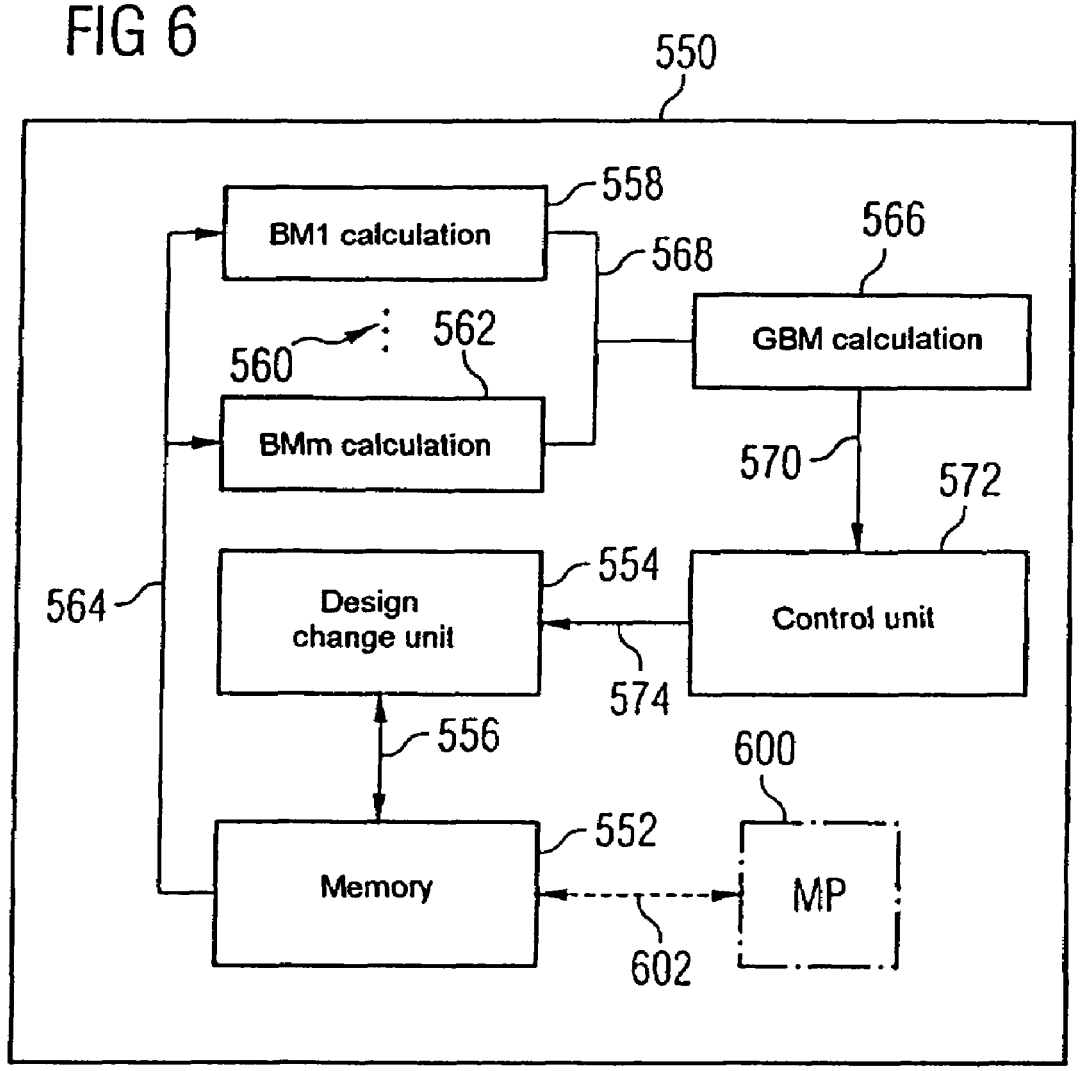

METHOD FOR MODIFYING DESIGN DATA FOR THE PRODUCTION OF A COMPONENT AND CORRESPONDING UNITS

This application is the national stage application of international application number PCT/DE2003/01862, filed on Jun. 5, 2003, which claims the benefit of priority to German Patent Application DE 102 269 15.7, filed on Jun. 17, 2002, both of which are incorporated herein by reference.

The invention relates to a method in which design data are prescribed which stipulate a geometrical design for a component, e.g. for an integrated circuit arrangement or for another electronic component.

The design data are, by way of example, grid data, which stipulate individual pixels in a grid, or vector data, which stipulate the design using vectors of particular length and particular direction. In the simplest case, the design is two-dimensional, e.g. in the case of a design for a position for an integrated circuit. A three-dimensional design is used, by way of example, to stipulate the relationship between various positions. The geometric design stipulates the external shape of elements of the component, e.g. the outline of an interconnect or the shape of a contact-hole interconnect region.

It is an object of the invention to specify a simple method for altering design data which is particularly suitable for optimizing a design. The intention is also to specify associated units.

The inventive method involves the automatic performance of a plurality of cycles of the following method steps:

the design data are used to produce altered design data which are stored and stipulate a geometrical design which is altered locally in comparison with the geometrical design of the design data.

The altered design data are used to ascertain an assessment criterion for the altered design.

Next, the assessment criterion for the altered design is compared with an assessment criterion for the design which is to be altered.

The unaltered design data are retained or replaced with the altered design data depending on the comparison result.

In the next cycle, the altered design data are used as design data which are to be altered. The assessment criterion calculated for the altered design data is used as assessment criterion for the design which is to be altered.

The inventive method means that the optimization of a design, which has been performed predominantly manually to date, can be performed automatically. The automatic assessment of the designs within the context of optimization makes it possible to achieve automatic optimization in a simple manner.

The local alteration essentially retains advantages of the design which have been achieved to date. Hence, those parts of the design which are situated outside of the local region are not altered during a cycle. The parts which are situated within a region which is to be altered locally can be altered such that only comparatively moderate changes are made in each cycle.

The assessment criteria are dependent on the type of component and the specific structure of the component. A single assessment criterion can be taken into account or an overall assessment criterion, which includes a plurality of assessment criteria which may also assess demands which conflict with one another.

In the simplest case, the comparison of the assessment criteria is the formation of a difference, for example. Other comparison methods may also be used, however.

Suitable rules are prescribed for retaining or for replacing the unaltered design data. These rules are either deterministic or dependent on a random variable. Taking random variables into account provides the option of also accepting small losses during a cycle so as ultimately to improve the overall design to an extent which it would not be possible to achieve if every cycle were also required to produce an improvement.

In one development of the inventive method, a region for the local alteration and the size of this region are ascertained or prescribed without using a random function. Alternatively, the region and its size may also be ascertained using a random function, however. Through a suitable choice of method for ascertaining the region and its size, it is possible to reduce the number of cycles needed for a particular improvement on the basis of the design which is to be improved.

In a subsequent development, a region for the local alteration and the size of this region are chosen on the basis of an even distribution. This measure ensures that all regions of the design are included in the method to the same extent. Alternatively, the region or its size is selected by favoring regions or sizes which particularly impair the alteration of the assessment criterion toward the aim of the method. If the assessment criterion is intended to be reduced in the course of the method, for example, then regions in which the assessment criterion is particularly high are favored. This measure also results in the number of cycles required for a particular improvement being reduced.

In another development of the method for altering design data, a region which has a square area, for example, is selected for producing the altered design data in the design stipulated by the design data which are to be altered. This is followed by ascertainment of the design data which relate to the design in the selected regions. The ascertained design data are altered on the basis of a prescribed function which brings about a geometrical alteration of the design in the selected region. In this way, the design data can be altered in a simple manner.

The geometrical alteration can be made using simple image processing methods, for example using filter functions or using simple geometrical functions, such as relocation, mirror imaging, rotation, expansion or contraction. A simple geometrical alteration also involves the design of the selected region being replaced with the design of a geometrically similar region at another location of the design which is to be altered or with prescribed design parts which are similar to the selected design part. The geometrical alteration is not limited to the size of the design which is to be altered. If it is also permissible to increase the size of the total area, for example, then the overall assessment criterion can nevertheless be improved in many cases.

If, in one development, the stipulation for the geometrical alteration is ascertained using a random function, then no complicated rules for altering the design need to be prescribed. By testing and subsequently assessing the alteration, improvements can be obtained in a simple manner.

Suitable assessment criteria for electronic components are the following assessment criteria, in particular:

the critical area for short circuits,
the critical area for interruptions,
the number of corners or the number of edges in the design,
the current-carrying capacity, coupling capacitances,
the overlap for elements, and
the total area of the design.

The critical areas are ascertained, by way of example, assuming circular defects in a prescribed size distribution. The size distribution is chosen such that defects which arise during the production of the component are simulated in the best possible manner.

In one refinement, a plurality of designs of vertically arranged interconnect planes are simultaneously processed in line with the inventive method. In this way, the designs can be optimized particularly well, for example in terms of the coupling capacitances or the overlaps between interconnects.

In a subsequent development, the assessment criterion is an overall assessment criterion which is ascertained from at least two different assessment criteria. In a subsequent development, weighting factors are prescribed which are used when the overall assessment criterion is ascertained from the individual assessment criteria. This measure makes it possible to take various assessment criteria into account to different degrees when carrying out the method. It also provides the option for particular assessment criteria to have a great influence on the alterations at the start of performance of the method, said influence then subsiding in the course of the method in favor of the influence of assessment criteria with a small weighting factor. The weighting is performed in a linear fashion or else on the basis of a nonlinear function.

In a subsequent development, the decision about the replacement of the unaltered result data is made on the basis of a random function. This measure allows not only an alteration which immediately must result in an improvement to the design to be carried out in a cycle. It also permits alterations to be accepted, on the basis of a particular probability, which result in no or only in insignificant impairment of the assessment criterion.

In a subsequent development, the dependency of the decision for or against acceptance of the random function is reduced on the basis of the number of cycles. This means that at the start of the method the acceptance of partial designs which result in an impairment, for example, is also permitted more frequently than at the end of the method. Such methods are also referred to as simulated annealing.

In another development of the inventive method, the designs have a grid dimension chosen for them which is equal to the width of a mask writing beam which is used for transferring the design onto a lithographic mask, e.g. onto a photomask. The designs produced using the method can thus easily be transferred onto the photomask without additional measures. In the case of one alternative, however, the designs have a grid dimension chosen for them which is less than the width of the mask writing beam. Such a procedure also sometimes results in masks which are very well suited to exposure.

The invention also relates to a data processing installation and a program which are suitable for carrying out the inventive method or one of its developments. The aforementioned technical effects thus also apply to the data processing installation and the program.

Suitable components whose design is improved using the inventive method are, in particular:
an integrated circuit arrangement, particularly a subcircuit which occurs in larger circuit arrangements very often, e.g. more than one hundred times or even more than one thousand times. This relates to the circuit of a memory cell, of a contact-hole region or of a basic logic function, e.g. of an OR gate or of a NAND gate,
a display, particularly a flat screen,
a sensor,
a micromechanical component,
a printed circuit board, and
an electrical or electronic component on a film basis.

Figure 5:
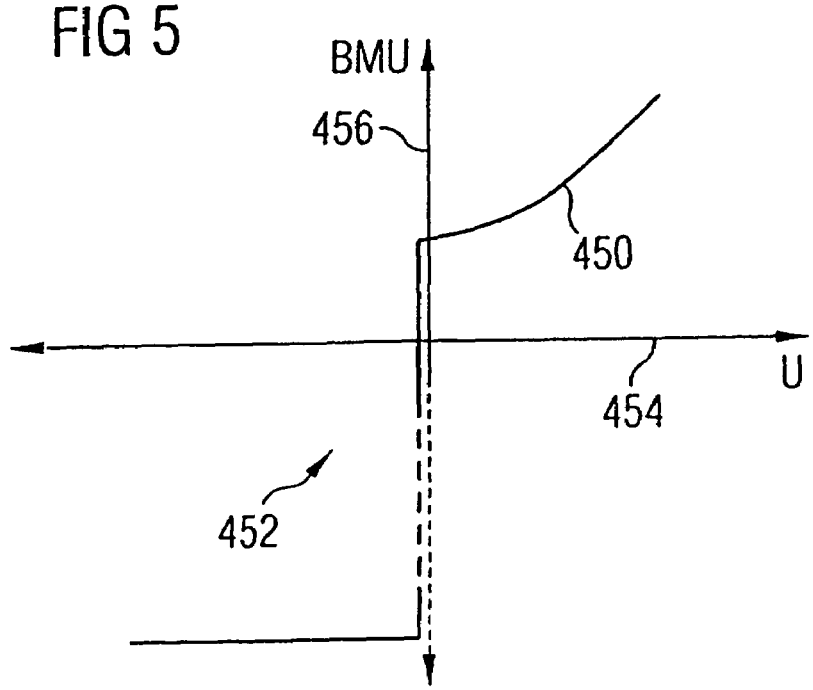

Exemplary embodiments of the invention are explained below with reference to the appended drawings, in which:

FIGS. 1A to 1C show the optimization of a design based on a first exemplary embodiment, FIG. 2 shows the result of optimization based on a second exemplary embodiment, FIG. 3 shows method steps for optimizing a design, FIG. 4 shows the profile of an assessment function for the current density in an interconnect, FIG. 5 shows the profile of an assessment function for an overlap between, an interconnect and a contact hole, and FIG. 6 shows functional units in an electronic circuit for optimizing the design.

FIG. 1A shows a design 10 for a part of an integrated circuit arrangement. The design 10 contains the outline 12 of an unbranched interconnect and the outline 14 of an interconnect branched in a T shape. The outlines 12 and 14 are shown in a coordinate system 16 which has an x-axis 18 for showing a grid dimension in the x-direction and a y-axis 20 for showing a grid dimension in the y-direction. The design 10 has the size of twenty grid points in the x-direction and of sixteen grid points in the y-direction.

The outline 12 is shown in the design 10 by three edge lines 22, 24 and 26, which run from a terminal point T1 to a terminal point T2, and by three edge lines 28, 30 and 32, which run from a terminal point T3 to T4. The outline 14 is shown by three edge lines 34, 36 and 38, which run from a terminal point T5 to a terminal point T6, by four edge lines 40 to 46, which run from a terminal point T7 to a terminal point T8, and by two edge lines 48, 50, which run from a terminal point T9 to a terminal point T10. Ten corner points 52 to 70 are respectively located at the point of contact between two edge lines 22 to 50 in various directions. The edge lines 22 to 50 are located either in the x-direction, in the y-direction or at an angle of 45 degrees or 135 degrees to the x-axis 20.

The terminal points T1 and T2 represent a left-hand connection on the unbranched interconnect shown by the outline 12. The terminal points T2 and T4 represent a right-hand connection on the unbranched interconnect.

The terminal points T5 and T7 represent a left-hand connection on the branched interconnect shown by the outline 14. The terminal points T6 and T10 represent a left-hand connection on the branched interconnect. The terminal points T8 and T9 represent a bottom connection on the interconnect, with the directions referring to the design 10 as is shown in FIG. 1B.

The position of the terminal points T1 to T10 is firmly prescribed in the exemplary embodiment. This means that during optimization of the design 10 the outlines 12 and 14 may be altered only within the region situated between the terminal points T1 to T10. The position of the terminal points T1 to T6 is firm, on the other hand.

FIG. 1B shows a design 10a with relocation in a relocation region 100. The relocation arises when carrying out the optimization method explained below with reference to FIG. 3 in a first cycle. The relocation region 100 is located in the top left-hand corner of the design 10 and has a length of seven grid points in the x-direction and a length of six grid points in the y-direction 20. The relocation region 100 contains the terminal points T1 and T3. A right-hand boundary line 102 for the region 100 intersects the edge line 22 at an auxiliary point HT1 which is situated approximately in the center of the edge line 22. The right-hand boundary line 102 intersects the edge line 28, situated parallel to the edge line 22, at an auxiliary point HT2 which is situated somewhat to the right of the center point of the edge line 28. Within the region 100, the edge lines 22 and 28 are shown by dashed lines 104 and 106, since the edge lines 22 and 28 are relocated there in the first optimization cycle in a randomly chosen direction and by a randomly chosen number of grid points.

In the exemplary embodiment, it is assumed that in the first method step the randomly chosen direction is a direction which is the opposite of the y-direction. The randomly chosen grid dimension has the value one, cf. relocation arrow 108. On account of the relocation in the relocation region 100, the dashed line 104 is relocated by one grid point counter to the y-direction 20. The terminal point T1 and the auxiliary point HT1 remain unchanged at their original position, however. The dashed line 104 produces a new edge line 110 which is parallel to the dashed line 104 and ends at corner points E1 and E2. The corner points E1 and E2 are then connected by inclined edge lines 112 and 114 to the terminal point T1 and to the auxiliary point HT1, respectively, in accordance with the grid, i.e. while retaining neighborhood relations.

The dashed line 106 is relocated in the same way. In this case, the result is an edge line 116 which is relocated one grid point downward parallel to the dashed line 106 and is situated between two corner points E3 and E4. Next, an edge line 118 is produced which runs from the terminal point T3 to the corner point E3. An edge line 120 is produced such that it runs from the terminal point E4 to the auxiliary point HT2.

The relocation operation indicated by means of the relocation arrow 108 relocated the outline 12 of the unbranched interconnect one grid point downward within the region 100 without altering the width of the outline 12 in the process. The relocation was executed such that both terminal points T1 to T10 and auxiliary points HT1 and HT2, at which edge lines 22 to 50 in the design 10 intersect boundary lines 102 for the relocation region 100, remain unaltered in their position. Starting from the altered design 10a, the steps explained below with reference to FIG. 3 for assessing the altered design 10a are carried out. If it is established that an improvement has been made to the design 10, the design 10 is always accepted for the rest of the optimization method with the alteration produced in the region 100. If no improvement has been made, on the other hand, then the rest of the optimization is usually performed without the alteration produced in the relocation region 100, i.e. again starting from the design 10.

In a subsequent cycle of the optimization method, a relocation region is again selected randomly, e.g. a relocation region 122 which is situated further in the center of the design 10 or 10a than the relocation region 100. The relocation region 122 is also somewhat larger than the relocation region 100. In the relocation region 122, edge lines are again relocated in a randomly chosen direction and by a randomly chosen number of grid points.

FIG. 1C shows a design 10b which has been produced from the design 10 using the optimization method which is explained below with reference to FIG. 3. During optimization, short circuits were weighted twice as highly as interruptions. The outlines 12 and 14 of the interconnects have changed, and outlines 12b and 14b have been produced. Four edge lines 150 to 156 are now situated between the terminal points T1 and T2. There are now just two edge lines 156 and 158 between the terminal points T3 and T4.

The outline 14b for the branched interconnect is formed by two edge lines 160 and 162 between the terminal points T5 and T6, by three edge lines 164, 166 and 168 between the terminal points T7 and T8 and by two edge lines 170 and 172 between the terminal points T9 and T10. In the design 10b, there are now just eight corner points 180 to 194. This simplifies mask production.

FIG. 2 shows a design 10c which has been produced from the design 10 when carrying out an optimization method in line with FIG. 3, with short circuits having been weighted ten times as highly as interruptions. An outline 12c for the unbranched interconnect is now shown by four edge lines 200 to 206 between the terminal points T1 and T2 and by three edge lines 208, 210 and 212 between the terminal points T3 and T4. An outline 14c for the branched interconnect is shown by three edge lines 214, 216, 218 between the terminal points T5 and T6, by three edge lines 220, 222 and 224 between the terminal points T7 and T8 and by three edge lines 226, 228 and 230 between the terminal points T9 and T10. There are eleven corner points 250 to 270 in the design 10c. It can easily be seen that the interspaces between the outlines 12c, 14c of the interconnects and the interspaces between the interconnects have been widened automatically at the cost of the width of the outlines 12c, 14c and the width of the interconnects, in order to reduce the occurrence of short circuits. The number of corner points has increased just by one corner point, which means that the mask production on the basis of the design 10c is only insignificantly more complex in comparison with the design 10.

FIG. 3 shows method steps for optimizing a design for producing an integrated circuit arrangement, for example for optimizing the design 10 shown in FIG. 1.

The method starts in a method step 300 with the stipulation of a plurality of parameters. By way of example, a step count variable n is set to the value one. A constant for indicating the number of steps N is set to the value one thousand, for example. An overall assessment criterion GBM is set to a very small value, e.g. to the value minus ten thousand. The value of this overall assessment criterion GBM is intended to become as large as possible in the course of the method, because its value is in an inversely proportional relationship with the level of the costs which are to be expected. In addition, weighting factors W1 equal to two and W2 equal to one are prescribed which indicate the weighting of an assessment criterion for short circuits and of an assessment criterion for interruptions. The stipulation of the values in method step 300 is dependent on the type of design which is to be optimized. In addition, the stipulation of the values is determined by the objective of the optimization, cf. the explanations relating to FIGS. 1C and 2, for example.

In a method step 302, a design to be optimized is prescribed, e.g. the design 10 by the data contained in a GDS2 file. The design 10 is the result of a manual design process or the result of earlier automatic optimization which is now intended to be reoptimized on the basis of different criteria, for example. The prescribed design is stored as the best design to date, i.e. as a "best-ever" design.

In a subsequent method step 304, the data processing installation carrying out the method automatically selects a relocation region within the design, e.g. the relocation region 100 or the relocation region 122. This takes account of a random function, for example. In addition, in method step 304 the size of the relocation region is prescribed, for example likewise taking into account a random function within a prescribed size range.

Next, an offset direction and an offset criterion are chosen in a method step 306, with random functions again being taken into account, for example. In a subsequent method step 308, parts of the design to be optimized within the relocation region 100, 122 are then offset on the basis of the values determined in method step 306. The offsetting operation has been explained above for the relocation region 100 with reference to FIG. 1B.

In a method step 310, the altered design, possibly only taking into account the relocation region 100 plus a suitable boundary region, is taken as a basis for calculating an assessment criterion BM1 for the occurrence of short circuits and an assessment criterion BM2 for the occurrence of interruptions. In this case, "critical areas" are taken into account, which apply to defects of a prescribed size.

In a method step 312, an overall assessment criterion GBM for the method step currently being carried out is calculated. In this case, the assessment criteria BM1, BM2 and the weighting factors W1 and W2 are used. By way of example, the following formula applies:

$$GBM(n)=W1 \cdot BM1+W2 \cdot BM2.$$

In a method step 314, the overall assessment criterion GBM(n) calculated in method step 312 is compared with the overall assessment criterion GBM(n−1) calculated for the preceding method cycle or, in the case of the first cycle, with the overall assessment criterion GBM prescribed in method step 300. If it is established that the value of the overall assessment criterion has increased in the current cycle, then method step 314 is followed immediately by a method step 316 in which the alteration to the design is accepted. In addition, the value calculated in method step 312 for the overall assessment criterion is recorded as the overall assessment criterion which is valid for performing further cycles when the alteration is accepted.

If, on the other hand, it is established in method step 314 that the overall assessment criterion GBM has not increased, i.e. the overall assessment criterion GBM has remained unchanged or has decreased in size, then method step 314 is followed immediately by a method step 318.

In method step 318, a prescribed method taking into account a random function is used to ascertain whether the alteration to the design is intended to be accepted for the rest of the method or rejected. A function used in this context is the following function, for example in the case of the "metropolis method":

$$p=\exp(-\Delta GBM/T),$$

where p denotes the probability of acceptance, exp denotes the exponential function, ΔGBM denotes the difference between GBM(n−1) and GBM(n), and T denotes a parameter which can be equated to a simulation temperature.

The parameter T can be altered in the course of the method, for example on the basis of one of the two following formulae:

$$T(n)=T0/(1+\ln n),$$

$$T(n)=T0/(1+n),$$

where T0 denotes a constant which can be physically equated to a high temperature, n denotes the step count variable and ln denotes the natural logarithm.

Using the exponential function, the reduction in the overall assessment criterion GBM (which is brought about by the alteration) is taken as a basis for determining a value p which indicates a probability with which the alteration will be accepted. A random number generator is used to generate a number which is randomly in a range between zero and one. If the random value generated using the random number generator is smaller than the value determined using the function, then there is acceptance. If, on the other hand, the random value is larger than or equal to the value taken from the function, then the alteration to the design is rejected. If the design is accepted, then the overall assessment criterion calculated in method step 312 is also accepted for the rest of the method. If the alteration is rejected, on the other hand, then the overall assessment criterion calculated in method step 312 is likewise rejected as invalid.

Both method step 316 and method step 318 are followed immediately by a method step 319, in which a check is carried out to determine whether the current design has a smaller overall assessment criterion than the best design. If the current design's overall assessment criterion is smaller than the best design's overall assessment criterion, then the current design is accepted as the best design. If, on the other hand, the current design's overall assessment criterion is not smaller than the best design's overall assessment criterion, then the current design is not accepted as the best design, which means that the best design is not altered.

In a method step 320 which follows method step 319, a check is carried out to determine whether the value of the step count variable n has already reached the value of the prescribed number of steps N. If this is not yet the case, then method step 320 is followed immediately by a method step 322. In method step 322, the value of the step count variable n is increased by the value one. In addition, the selectivity of the function explained below with reference to FIG. 6 is increased continuously or on the basis of another suitable method. This also increases the selectivity during the random selection. The probability of impairments in the design being accepted falls as the number of method cycles increases.

When method step 322 has been carried out, the method is continued in method step 304 with a new cycle. The method is now in a method loop comprising method steps 304 to 322, said loop being executed until method step 320 establishes that the step count variable n has reached the value of the number of steps N. In this case, method step 320 is followed immediately by a method step 324, in which the optimization method is terminated. The design stored as the best design is output as the result, e.g. in a file.

Alternatively or in addition to the abort option just explained, the method may also be terminated if the change in the overall assessment criterion GBM undershoots a prescribed limit over k cycles, where k is a natural number greater than two, e.g. 100. Particularly in the case of larger k values, it must be assumed that a "stable" solution has been achieved.

The optimization method explained with reference to FIG. 3 is a type of simulated annealing which ensures that maximization of the overall assessment criterion GBM finds not only a local maximum but also the global maximum. This means that actually the optimum design and not just a suboptimum design is ascertained depending on the stipulations in method step 300.

FIG. 4 shows the profile of an assessment function 400 which is used during another exemplary embodiment additionally for ascertaining an assessment criterion BMD to assess the current density D in the changed design. The assessment function 400 is shown in a coordinate system 402 which has an x-axis 404 for showing the values of the current density D and a y-axis 406 for showing the values of the assessment criterion BMD. In the range of very small current densities D up to a maximum current density Dmax, the value of the assessment criterion MD drops from very large positive values to a small positive value in line with a falling exponential function. Exceeding the maximum current density Dmax is "punished" by the choice of a very large negative value for the assessment criterion BMD, because a design rule has been infringed. In method step 310, the current density D is calculated for a structure which is intended to be produced using the changed design. After that, the associated value of the assessment criterion D is ascertained for the calculated current density D using the assessment function 400 and is weighted with a weighting factor W3 when calculating the overall assessment criterion GBM.

FIG. 5 shows the profile of an assessment function 450 for the overlap U between an interconnect and a contact hole situated underneath. The assessment function 450 is shown in a coordinate system 452 which has an x-axis 454 for showing the value of the overlap U and a y-axis 456 for showing the values of an assessment criterion BMU for assessing the overlap. The values of the overlap U may also become negative if no overlap or a distance which is transverse with respect to the actual direction of overlap arises. The assessment criterion BMU has a large negative value for negative values of the overlap U. For small overlaps U, the assessment criterion BMU has a small positive value. As the overlap U rises, the assessment function 450 then increases in line with an exponential function.

In a subsequent exemplary embodiment, the assessment criterion BMU is used to calculate the overall assessment criterion GBM in method step 310. A weighting factor W4 is used to weight the assessment criterion BMU.

FIG. 6 shows functional units in an electronic circuit 550 which is used to optimize the design 10 and hence to carry out the method steps explained with reference to FIG. 3. In line with one exemplary embodiment, the circuit 550 does not contain a processor, but rather only logic circuits.

The design 10 is stored in a memory unit 552. A design change unit 554 is used to change the design in a relocation region 106, 122. The design change unit 554 uses a bus system 556 to access the memory unit 552 bidirectionally. Assessment criterion calculation units 558 to 562 are used to calculate assessment criteria BM1 to BMm, where m is a natural number for denoting the last assessment criterion. The assessment criterion calculation units 558 to 562 read the data for the altered design, e.g. 10a, which are stored in the memory 552 via a bus system 564.

The overall assessment criterion GBM is calculated in an overall assessment criterion calculation unit 566 whose input side is connected to outputs of the assessment criterion calculation units 558 to 562 via lines 568. The calculation unit 566 performs the calculation of the overall assessment criterion which was explained in FIG. 3 for method step 312. The calculation unit 566 outputs the calculated overall assessment criterion GBM to a control unit 572, which is used for controlling the optimization method, via a line 570.

The control unit 572 controls the other units in the circuit 550, cf. control line 574 for controlling the design change unit 554, for example. The control line 574 is used to prescribe, by way of example, the position of a relocation region, e.g. 100, 122, the direction, e.g. 108, of the relocation, and the relocation criterion.

In another exemplary embodiment, the circuit 550 also contains a processor 600 which executes commands in a program which is stored in the memory unit 552. The processor 600 accesses the memory unit 552 via a bus system 602. When using the processor 600, the functions of the design change unit 554, of the assessment criterion calculation units 558 to 562, of the GBM calculation unit 566 and of the control unit 572 are provided when the commands in the program are executed. Instead of the lines 568, 570 and 574, transfers of parameters to memory cells are used for data interchange.

While method steps 316 and 318 apply to the "metropolis method" of simulated annealing, in a subsequent exemplary embodiment both method step 316 and method step 318 involve a random decision being made on the basis of the difference between the overall assessment criteria. A suitable function for determining the comparison value for the random value is sigmoid functions, for example, whose gradient is dependent on the value of the temperature T.

In another exemplary embodiment, instead of the "simulated annealing" optimization method a different optimization method is used:

by way of example, the relocation is ascertained which results in the greatest improvement to the overall assessment criterion GBM in each method cycle. Such a method is known as a method for calculating the greatest ascent or descent (steepest-descent method), or a "genetic algorithm", in which the design region from another design is accepted on the basis of prescribed criteria, or a combination of said optimization methods.

In a further exemplary embodiment, the overall assessment criterion is reduced in size in order to improve the design. For this, it is necessary to choose the assessment functions such that improvements to the design result in smaller assessment criteria.

The invention claimed is:

1. A method for altering design data for producing a component, the method comprising:

prescribing design data which stipulate a geometrical design which is to be altered for the component;

producing and storing an altered design from the design data, the altered design stipulating a geometrical alteration which is altered locally in a region in comparison with the geometrical design of the stored design data;

ascertaining an assessment criterion for the altered design from the altered design data, the assessment criterion ascertained for an area for the altered design or the region including at least one of: a critical area for short circuits and a critical area for interruptions, the critical areas ascertained assuming defects in a prescribed size distribution, the size distribution chosen such that defects which arise during production of the component are simulated;

comparing the assessment criterion for the altered design with an assessment criterion for the geometrical design;

retaining the design data or replacing the design data with the altered design data depending on a result of the comparison; and automatically performing a plurality of cycles of alterations, comparisons and decisions about replacement, wherein at least one of:

the geometrical alteration comprises relocation of a design part in the region by a prescribed distance or by a prescribed number of points of a grid dimension and in a prescribed direction, the geometrical alteration comprises mirror imaging of the design part in the region on a prescribed mirror axis, the geometrical alteration comprises rotation of the design part in the region about a prescribed center of rotation and through a prescribed angle of rotation, the geometrical alteration comprises uniform or non-uniform expansion or contraction of the design part in the region in at least one prescribed direction and by at least one prescribed scaling factor, the geometrical alteration relates to smoothing of lines of the design part in the region, the geometrical alteration comprises replacement of the design part in the region with a design part from another region of the design or with a prescribed design part or with a corresponding design part of a design from an earlier cycle, the corresponding region situated at the same location in the design as the region or having a similar geometry to the region, the corresponding region is a region from the best design ascertained in the method to date, and the geometrical alteration brings about a change to the total area of the changed design in comparison with a total area of the design which is to be changed.

2. The method as claimed in claim 1, wherein at least one of a position of the region for the local alteration and a size of the region is ascertained without using a random function.

3. The method as claimed in claim 1, wherein at least one of a position of the region for the local alteration and a size of the region is selected on a basis of an even distribution.

4. The method as claimed in claim 1, wherein the region is selected for producing the altered design data in the design stipulated by the design data which are to be altered, design data are ascertained which relate to the design in the region, and the ascertained design data are altered on the basis of a prescribed function which brings about geometrical alteration of the design in the region.

5. The method as claimed in claim 4, wherein at least one stipulation for the geometrical alteration is ascertained using a random function.

6. The method as claimed in claim 1, wherein the assessment criterion is an overall assessment criterion which is ascertained from at least one of:

at least two different assessment criteria, and weighting factors with different values prescribed and used for weighting the assessment criteria when ascertaining the overall assessment criterion.

7. The method as claimed in claim 1, wherein a decision about retaining or replacing the design data is made on the basis of a random function.

8. The method as claimed in claim 7, wherein the dependency of the decision on the random function is reduced on the basis of the number of cycles.

9. The method as claimed in claim 1, wherein the design has a grid dimension which is equal to or less than a width of a mask writing beam which is used for transferring the design onto a lithographic mask.

10. The method as claimed in claim 1, wherein at least one of a position of the region for the local alteration and a size of the region is ascertained using a random function.

11. The method as claimed in claim 1, wherein at least one of a position of the region for the local alteration and a size of the region is selected by favoring at least one of regions and sizes which particularly impair the alteration of the assessment criterion toward the aim of the method.

12. A method for altering design data for producing a component, the method comprising:

prescribing design data which stipulate a geometrical design which is to be altered for the component;

producing and storing an altered design from the design data, the altered design stipulating a geometrical alteration which is altered locally in a region in comparison with the geometrical design of the stored design data;

ascertaining an assessment criterion for the altered design from the altered design data, the assessment criterion ascertained for an area for the altered design or the region including at least one of: a critical area for short circuits and a critical area for interruptions, the critical areas ascertained assuming defects in a prescribed size distribution, the size distribution chosen such that defects which arise during production of the component are simulated;

comparing the assessment criterion for the altered design with an assessment criterion for the geometrical design;

retaining the design data or replacing the design data with the altered design data depending on a result of the comparison; and automatically performing a plurality of cycles of alterations, comparisons and decisions about replacement, wherein the ascertainment of the assessment criterion involves at least one of;

ascertaining a number of corners or a number of edges in the altered design or in the region, ascertaining a current-carrying capacity of at least one structure which is to be produced using the design, ascertaining a coupling capacitance between an element of an integrated circuit arrangement which is to be produced and at least one structure which is to be produced using the design, ascertaining an overlap between the element of the integrated circuit arrangement which is to be produced and at least one structure which is to be produced using the design, and calculating the total area of the changed design.

13. A data processing installation for automatically altering design data for producing a component, the data processing installation comprising:

a memory unit for storing design data which are to be altered and stipulate a geometrical design which is to be altered for the component;

a change unit which uses the design data to produce altered design data for an altered design and stores the altered design data in the memory unit;

an assessment criterion ascertainment unit which ascertains an assessment criterion from the altered design data, the assessment criterion for an area ascertained for the altered design or region including at least one of a critical area for short circuits and a critical area for interruptions, the critical areas being ascertained assuming defects in a prescribed size distribution, the size distribution chosen such that defects which arise during production of the component are simulated;

a comparison unit which compares the assessment criterion for the altered design with an assessment criterion for the geometrical design; and a control unit which retains the unaltered design data or replaces the unaltered design data with the altered design data depending on a result of the comparison, wherein the data processing installation performs a plurality of cycles of alterations, comparisons and decisions about replacement, and the ascertainment of the assessment criterion involves at least one of:

ascertaining a number of corners or a number of edges in the altered design or in the region, ascertaining a current-carrying capacity of at least one structure which is to be produced using the design, ascertaining a coupling capacitance between an element of an integrated circuit arrangement which is to be produced and at least one structure which is to be produced using the design, ascertaining an overlap between the element of the integrated circuit arrangement which is to be produced and at least one structure which is to be produced using the design, and calculating the total area of the changed design.

14. The data processing installation as claimed in claim 13, wherein at least one of a position of the region for the local alteration and a size of the region is ascertained without using a random function.

15. The data processing installation as claimed in claim 13, wherein at least one of a position of the region for the local alteration and a size of the region is selected on a basis of an even distribution.

16. The data processing installation as claimed in claim 13, wherein at least one stipulation for the geometrical alteration is ascertained using a random function.

17. The data processing installation as claimed in claim 13, wherein the assessment criterion is an overall assessment criterion which is ascertained from at least one of:

at least two different assessment criteria, and weighting factors with different values prescribed and used for weighting the assessment criteria when ascertaining the overall assessment criterion.

18. The data processing installation as claimed in claim 13, wherein a decision about retaining or replacing the unaltered design data is made on the basis of a random function.

19. The data processing installation as claimed in claim 18, wherein the dependency of the decision on the random function is reduced on the basis of the number of cycles.

20. The data processing installation as claimed in claim 13, wherein the design has a grid dimension which is equal to or less than a width of a mask writing beam which is used for transferring the design onto a lithographic mask.

21. The data processing installation as claimed in claim 13, wherein at least one of a position of the region for the local alteration and a size of the region is ascertained using a random function.

22. The data processing installation as claimed in claim 13, wherein at least one of a position of the region for the local alteration and a size of the region is selected by favoring at least one of regions and sizes which particularly impair the alteration of the assessment criterion toward the aim of the method.

23. A program or data store having a program which contains a command sequence whose execution by a processor involves carrying out a method for altering design data for producing a component, the method comprising:

prescribing design data which stipulate a geometrical design which is to be altered for the component;

producing and storing an altered design from the design data, the altered design stipulating a geometrical alteration which is altered locally in comparison with the geometrical design of the stored design data in a region;

ascertaining an assessment criterion for the altered design from the altered design data, the assessment criterion for an area ascertained for the altered design or region including at least one of: a critical area for short circuits and a critical area for interruptions, the critical areas ascertained assuming defects in a prescribed size distribution, the size distribution chosen such that defects which arise during production of the component are simulated;

comparing the assessment criterion for the altered design with an assessment criterion for the geometric design;

retaining the design data or replacing the design data with the altered design data depending on a result of the comparison; and automatically performing a plurality of cycles of alterations, comparisons and decisions about replacement, and wherein the ascertainment of the assessment criterion involves at least one of:

ascertaining a number of corners or a number of edges in the altered design or in the region, ascertaining a current-carrying capacity of at least one structure which is to be produced using the design, ascertaining a coupling capacitance between an element of an integrated circuit arrangement which is to be produced and at least one structure which is to be produced using the design, ascertaining an overlap between the element of the integrated circuit arrangement which is to be produced and at least one structure which is to be produced using the design, and calculating the total area of the changed design.

24. A data processing installation for automatically altering design data for producing a component, the data processing installation comprising:

a memory unit for storing design data which are to be altered and stipulate a geometrical design which is to be altered for the component;

a change unit which uses the design data to produce altered design data for an altered design and stores the altered design data in the memory unit;

an assessment criterion ascertainment unit which ascertains an assessment criterion from the altered design data, the assessment criterion for an area ascertained for the altered design or region including at least one of a critical area for short circuits and a critical area for interruptions, the critical areas being ascertained assuming defects in a prescribed size distribution, the size distribution chosen such that defects which arise during production of the component are stimulated;

a comparison unit which compares the assessment criterion for the altered design with an assessment criterion for the geometrical design; and a control unit which retains the unaltered design data or replaces the unaltered design data with the altered design data depending on a result of the comparison.

wherein the data processing installation performs a plurality of cycles of alterations, comparisons and decisions about replacement, and wherein at least one of:

the geometrical alteration comprises relocation of a design part in the region by a prescribed distance or by a prescribed number of points of a grid dimension and in a prescribed direction, the geometrical alteration comprises mirror imaging of the design part in the region on a prescribed mirror axis, the geometrical alteration comprises rotation of the design part in the region about a prescribed center of rotation and through a prescribed angle of rotation, the geometrical alteration comprises uniform or nonuniform expansion or contraction of the design part in the region in at least one prescribed direction and by at least one prescribed scaling factor, the geometrical alteration relates to smoothing of lines of the design part in the region, the geometrical alteration comprises replacement of the design part in the region with a design part from another region of the design or with a prescribed design part or with a corresponding design part of a design from an earlier cycle, the corresponding region situated at the same location in the design as the region or having a similar geometry to the region, the corresponding region is a region from the best design ascertained in the method to date, and the geometrical alteration brings about a change to the total area of the changed design in comparison with a total area of the design which is to be changed, and wherein the region is selected for producing the altered design data in the design stipulated by the design data which are to be altered, design data are ascertained which relate to the design in the region, and the ascertained design data are altered on the basis of a prescribed function which brings about geometrical alteration of the design in the region.

\* \* \* \* \*